United States Patent
Miyazaki et al.

(10) Patent No.: US 6,673,272 B2
(45) Date of Patent: Jan. 6, 2004

(54) CONDUCTIVE PASTE AND LAMINATED CERAMIC ELECTRONIC COMPONENT

(75) Inventors: Takaharu Miyazaki, Kurita-gun (JP); Tsuyoshi Yamana, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 53 days.

(21) Appl. No.: 09/899,323

(22) Filed: Jul. 5, 2001

(65) Prior Publication Data
US 2003/0064210 A1 Apr. 3, 2003

(30) Foreign Application Priority Data
Jul. 5, 2000 (JP) .......................................... 2000-204097

(51) Int. Cl.$^7$ ................................................. H01B 1/06
(52) U.S. Cl. ........................ 252/507; 252/513; 252/521
(58) Field of Search ................................. 252/507, 513, 252/521

(56) References Cited

U.S. PATENT DOCUMENTS 4,604,676 A * 8/1986 Senda et al. ................. 361/309
6,295,196 B1 * 9/2001 Hamaji et al. ............ 361/321.2

FOREIGN PATENT DOCUMENTS

JP 7-242845 9/1995
JP 8-259847 10/1996

OTHER PUBLICATIONS

English abstract of JP 7–242845.

* cited by examiner

*Primary Examiner*—Cathy Lam
(74) *Attorney, Agent, or Firm*—Dickstein, Shapiro, Morin & Oshinsky, LLP.

(57) ABSTRACT

A laminated ceramic electronic component, for example, monolithic ceramic capacitor, in which the delamination does not occur during baking and having superior thermal shock and moisture load resistance characteristics is provided. A conductive paste, used with advantage to form an internal electrode of the laminated ceramic electronic component, and a laminated ceramic electronic component using the conductive paste is provided. The conductive paste is composed of a conductive powder which is primarily Ni, an organic vehicle, a compound A containing at least one of Mg and Ca and which is an organic acid metal salt, oxide powder, metal organic complex salt and/or an alkoxide, and a compound B, having a hydrolyzable reactive group containing at least one of Ti and Zr, which adheres to the surface of the conductive powder.

10 Claims, 1 Drawing Sheet

CONDUCTIVE PASTE AND LAMINATED CERAMIC ELECTRONIC COMPONENT

BACKGROUND OF THE INVENTION

1. Field of the Invention

The present invention relates to a conductive paste and a laminated ceramic electronic component. In particular, the present invention relates to a conductive paste used with advantage as an internal electrode of a laminated ceramic electronic component, and relates to a monolithic ceramic capacitor.

2. Description of the Related Art

Hitherto, laminated ceramic electronic components, such as monolithic ceramic capacitors, have been provided with a laminate including a plurality of laminated ceramic layers and at least one internal electrode formed along a specified interface between the aforementioned ceramic layers.

In such a laminated ceramic electronic component, in general, the internal electrode is formed by printing and baking a conductive paste in which a conductive powder and an organic vehicle are dispersed in a solvent. More specifically, when the laminated ceramic electronic component is manufactured, a specified ceramic green sheet, which becomes a ceramic layer by baking, is printed with the conductive paste, which becomes an internal electrode, so as to form an electrode coating. Thereafter, a plurality of the aforementioned green sheets are laminated, are press-adhered, and are baked, so that the sintering of the internal electrodes is completed concurrently with the completion of sintering of the ceramic layers, and a ceramic laminate provided with the internal electrodes is formed. At this time, the melting point of the conductive powder constituting the internal electrodes must be higher than the sintering temperature of the ceramic. When the melting point of the conductive powder is lower than the sintering temperature of the ceramic, the conductive powder is molten during the baking, so that a break or crack is generated in the internal electrode after the baking so as to reduce coverage. Therefore, as the conductive powder constituting the internal electrode, Pt, Pd, W, Nb, Ni, etc., can be selected, and in addition to this, in order to realize reduction of the cost, a base metal, e.g., Ni, is used as the conductive powder.

In the laminated ceramic electronic component using such a base metal such as Ni for the internal electrode, however, accompanying the decrease in the layer thickness and the increase in the number of layers of the ceramic layers, a large residual stress is generated at the interface between the internal electrode and the ceramic layer due to the difference of shrinkages and the difference of coefficients of thermal expansion between the electrode coating formed by printing and the green ceramic layer during the baking. As a consequence, there is a problem in that the thermal shock resistance of the laminated ceramic electronic component is degraded. Furthermore, there is a problem in that the reliability at a high temperature and high humidity, that is, the moisture load resistance characteristics, is also degraded accompanying the decrease in the layer thickness and the increase in the number of layers of the ceramic layers.

Accompanying the decrease in the thickness of each ceramic layer, the thickness of the internal electrode must be decreased. Accordingly, the particle diameter of the conductive powder in the conductive paste for constituting the internal electrode must be further decreased. When the particle diameter of the conductive powder is further decreased, since the shrinkage of the internal electrode due to the sintering of the conductive powder occurs at a lower temperature during the baking, there is a problem in that delamination is likely to occur.

In order to solve the latter problem, for example, in Japanese Examined Patent Application Publication No. 7-56850, a monolithic ceramic capacitor in which a Ni internal electrode and a ceramic layer are connected with an aluminosilicate layer is disclosed. Regarding this monolithic ceramic capacitor, however, an improvement of the aforementioned problem, that is, the improvement of the thermal shock resistance, is not intended.

Furthermore, in Japanese Unexamined Patent Application Publication No. 8-259847, a conductive paste using a metallic powder coated with a reaction product of an organic silicon compound and water is disclosed. When this conductive paste is used for an internal electrode of a monolithic ceramic capacitor, however, since abnormal particle growth of the ceramic occurs due to a reaction of silicon in the paste and the ceramic, this is not effective to improve the aforementioned problem, that is, to improve the thermal shock resistance.

SUMMARY OF THE INVENTION

Accordingly, it is an object of the present invention to provide a conductive paste in which the delamination does not occur during a step of baking, having superior thermal shock resistance and superior moisture load resistance characteristics. It is another object to provide a laminated ceramic electronic component in which an internal electrode is formed using the aforementioned conductive paste.

In order to achieve the aforementioned objects, a conductive paste according to an aspect of the present invention is composed of a conductive powder primarily containing Ni, an organic vehicle, and a compound A containing at least one of Mg and Ca and at least one material selected from the group consisting of an organic acid metal salt, an oxide powder, a metal organic complex salt and an alkoxide, in which a compound B having a hydrolyzable reactive group containing at least one of Ti and Zr adheres to the surface of the aforementioned conductive powder.

A conductive paste according to another aspect of the present invention is composed of a conductive powder primarily containing Ni and an organic vehicle in which a compound A and a compound B adhere to the surface of the aforementioned conductive powder, the compound A contains at least one of Mg and Ca and is at least one organic acid metal salt, oxide powder, metal organic complex salt and/or alkoxide, and the compound B has a reactive group containing at least one of Ti and Zr.

The reactive group of the aforementioned compound B is preferably an alkoxyl group.

The aforementioned compound B is preferably an alkoxide.

The aforementioned compound B is preferably a coupling agent.

The adhesion amount of the aforementioned compound B is preferably about 0.1% to 5.0% by weight in terms of $TiO_2$ and $ZrO_2$ relative to 100% by weight of the aforementioned conductive powder.

The mole ratio of the total amount of Ti and Zr, in terms of $TiO_2$ and $ZrO_2$ contained in the aforementioned compound B, relative to the total amount of Mg and Ca, in terms of MgO and CaO contained in the aforementioned compound A, is preferably about 0.5 to 4.0.

A laminated ceramic electronic component according to another aspect of the present invention is provided with a ceramic laminate including a plurality of laminated ceramic layers and an internal electrode formed along an interface between the aforementioned ceramic layers in which the aforementioned internal electrode is formed by baking the aforementioned conductive paste according to the present invention.

The laminated ceramic electronic component according to the present invention is preferably further provided with a plurality of terminal electrodes provided at different positions on the end faces of the aforementioned laminate, and in which a plurality of aforementioned internal electrodes are electrically connected to one of the terminal electrodes.

The aforementioned ceramic layer in the laminated ceramic electronic component according to the present invention may be composed of a dielectric ceramic primarily containing barium titanate.

DESCRIPTION OF THE PREFERRED EMBODIMENTS

Figure 1:
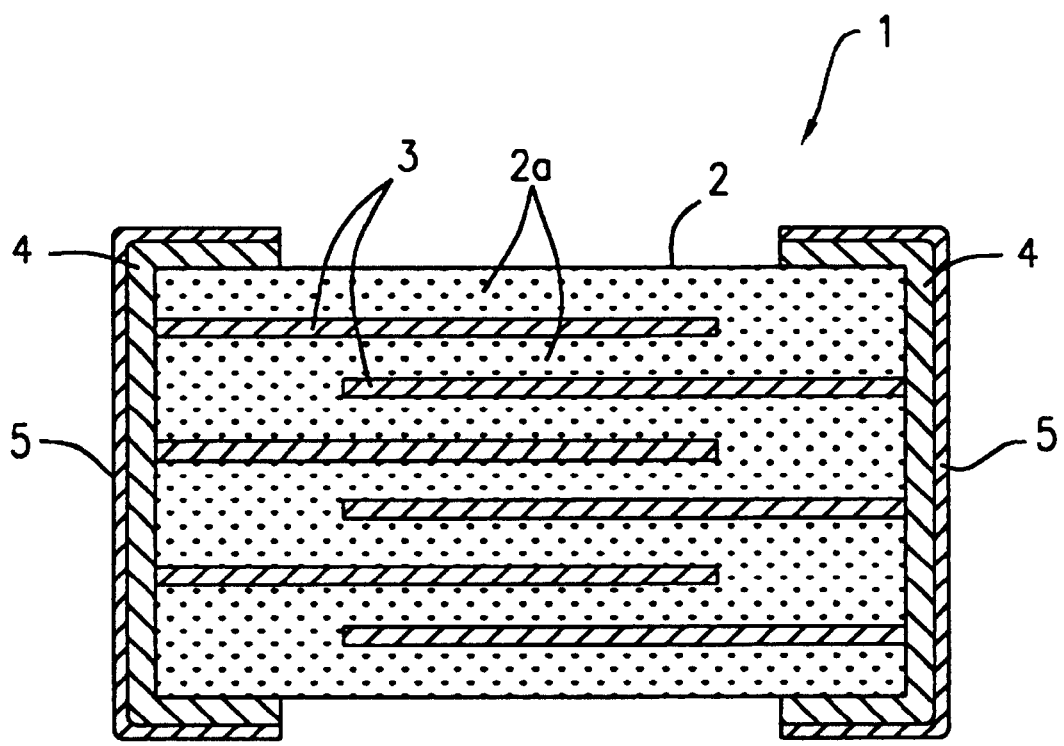
FIG. 1 is a sectional view of a monolithic ceramic capacitor according to an embodiment of the present invention.

The conductive paste according to the present invention contains a compound A and a compound B, and at least the compound B must adhere to the surface of the conductive powder by hydrolysis. An embodiment of a treatment method for adhering the compound B to the surface of the conductive powder is explained below. The conductive paste and the monolithic ceramic capacitor according to the present invention are not limited to be produced by the following one embodiment.

First, as a conductive powder, for example, a Ni powder is prepared. As the conductive powder, materials primarily containing Ni, for example, materials containing Cu, Ag, Au, Pt, Pd, alloys thereof, etc., in addition to Ni can be appropriately selected and can be used. The average particle diameter of the conductive powder is not specifically limited. In general, when the conductive powder is a fine particle, since the shrinkage of the internal electrode due to the sintering of the conductive powder occurs at a lower temperature, delamination is likely to occur. According to the present invention, however, this can be prevented from occurring, and the present invention exhibit remarkable effects, when the average particle diameter of the conductive powder is about 10 nm to 200 nm.

Next, the conductive powder is dispersed in such an organic solvent such as an alcohol so as to produce a suspension. In the case in which a conductive powder having an average particle diameter of 1 $\mu$m or less is used, in order to accelerate dispersion, an agitation is effective, and a dispersion machine, for example, an ultrasonic homogenizer, may be used, if necessary.

The compound B is added to the aforementioned suspension and is dispersed. The compound B must have a hydrolyzable reactive group containing at least one of Ti and Zr. Specifically, the compound B preferably contains one or more alkoxides or acetylacetonates, and more specifically, for example, tetrapropoxytitanium, titanium oxyacetylacetonato, tetrabutoxyzirconium, tetrapropoxyzirconium and zirconium acetylacetonato, can be mentioned.

Subsequently, water is dropped into the resulting suspension so as to hydrolyze the compound B. In the case in which the compound B is rapidly hydrolyzed, if necessary, a mixed solution in which water is diluted with an organic solvent, or a mixed solution in which a chelating agent, for example, amines and carboxylic acids, is appropriately added, is preferably used for the dropping. In the case in which the compound B is slowly hydrolyzed, it is preferable to use a mixed solution in which a hydrolysis catalyst, for example, mineral acids and ammonia water, has been appropriately added into water.

When compound A is adhered to the conductive powder in addition to the compound B, the compound A is also added into the suspension and is dispersed when the aforementioned compound B is added into the suspension and is dispersed.

The compound A must contain at least one of Mg and Ca and be at least one material selected from the group consisting of an organic acid metal salt, an oxide powder, a metal organic complex salt and an alkoxide. As the compound A, specifically, organic acid metal salts, for example, magnesium formate, magnesium acetate, magnesium lactate, magnesium stearate, magnesium octylate, calcium formate, calcium acetate, calcium lactate, calcium stearate, and calcium octylate, metal organic complex salts, for example, magnesium acetylacetonato and calcium acetylacetonato, and alkoxides, for example, di-n-butoxymagnesium and diethoxymagnesium, can be mentioned.

In the case in which the compound A is also adhered to the conductive powder, the adhesion form is not specifically limited. For example, when the compound A has a reactive group such as an alkoxide, the compound A is hydrolyzed so as to adhere to the conductive powder.

Then, the solvent and water are removed from the suspension by filtration, decantation, etc., and drying was performed so as to produce a conductive paste to which the hydrolysis product of the compound B is adhered or the compound A is further adhered.

The adhesion amount of the compound B according to the present invention is preferably about 0.1% to 5.0% by weight in terms of $TiO_2$ and $ZrO_2$ relative to 100% by weight of the conductive powder. When the aforementioned adhesion amount is about 0.1% by weight or more, an effect of decreasing a residual stress generated at an interface between the internal electrode and the ceramic layer is likely to be exhibited, so that the delamination is reliably prevented from generating. On the other hand, when the aforementioned adhesion amount is about 5.0% by weight or less, an effect of improving the thermal shock resistance of the electrode formed with printing and baking the aforementioned conductive paste is likely to be exhibited.

The mole ratio of the total amount of Ti and Zr, in terms of $TiO_2$ and $ZrO_2$ contained in the compound B according to the present invention, relative to the total amount of Mg and Ca, in terms of MgO and CaO contained in the compound A according to the present invention, is preferably about 0.5 to 4.0. When the aforementioned mole ratio is about 0.5 or more, the effect of decreasing residual stress generated at an interface between the internal electrode and the ceramic layer is likely to be exhibited, and the delamination is reliably prevented from generating. On the other hand, when the aforementioned mole ratio is about 4.0 or less, the effect of improving the thermal shock resistance of the electrode formed with printing and baking the aforementioned conductive paste is likely to be exhibited.

In an embodiment of the conductive paste according to the present invention, the conductive paste is composed of the conductive powder in which the compound B is adhered to the surface thereof by, for example, the aforementioned method, the organic vehicle, and compound A. In another embodiment of the conductive paste according to the present invention, the conductive paste is composed of the conductive powder in which compound A and compound B are adhered to the surface thereof by, for example, the aforementioned method, and the organic vehicle.

The method for manufacturing the conductive paste according to the present invention is not specifically limited. For example, the conductive powder is dispersed in an organic vehicle and is kneaded so as to produce the conductive paste in a manner similar to that in conventional conductive pastes.

In the manufacture of the conductive paste according to the present invention, the conductive powder subjected to the adhesion treatment of the compound A and the compound B may be used as it is, although may be used after being subjected to further heat treatment in air or nitrogen at 200° C. to 800° C., if necessary.

An embodiment of the laminated ceramic electronic component according to the present invention is explained below in detail with reference to FIG. 1. That is, a laminated ceramic electronic component 1 is provided with a ceramic laminate 2, internal electrodes 3, terminal electrodes 4, and plating films 5.

The ceramic laminate 2 is formed with baking a green ceramic laminate in which a plurality of ceramic layers 2a made of a dielectric material primarily containing, for example, $BaTiO_3$.

The internal electrodes 3 are provided between the ceramic layers 2a in the ceramic laminate 2, and are formed of the conductive paste according to the present invention baked concurrently with the green ceramic layers 2a by baking a plurality of green ceramic layers 2a printed with the conductive paste. Each of the end edges of the internal electrodes 3 and 3 is formed, for example, to expose at one of end faces of the ceramic laminate 2.

For example, in the case in which one end of each of the internal electrodes 3 is exposed at the end face of the ceramic laminate 2, the terminal electrodes 4 are formed by coating the conductive paste for constituting the terminal electrodes on the end face of the ceramic laminate 2, and by baking these, so that the terminal electrodes 4 are electrically and mechanically connect to the internal electrodes 3.

The plating films 5 are made of, for example, an electroless plating of Sn, Ni, etc., and a solder plating, and at least one layer is formed on the terminal electrodes 4.

The material for the ceramic laminate 2 is not limited to the aforementioned embodiment, and may be, for example, a dielectric material, for example, $PbZrO_3$, an insulating material, a magnetic material and a semiconducting material.

The number of layers of the internal electrodes 3 of the laminated ceramic electronic component according to the present invention is not limited to the aforementioned embodiment, and an arbitrary number of layers may be formed.

The terminal electrodes 4 are usually formed by coating the conductive paste containing a conductive powder, which is a material for the terminal electrode, on the baked ceramic laminate 2, and by baking the conductive paste, although, the terminal electrodes may be formed by coating the conductive paste on a green ceramic laminate before baking and by baking the conductive paste concurrently with the green ceramic laminate. The method for forming the terminal electrodes and the number thereof are not limited to the aforementioned embodiment.

The plating films 5 are not limited to the aforementioned embodiment, and the plating film may not be provided. Furthermore, an arbitrary number of layers may be formed.

EXAMPLES

Example 1

In the present embodiment, a monolithic capacitor having a structure as shown in FIG. 1 was manufactured as a laminated ceramic electronic component.

In order to produce a ceramic represented by the formula $\{(Ba_{1-x}Ca_x)O\}_m(Ti_{1-y}Zr_y)O_2$, wherein $1.005 \leq m \leq 1.03$, $0.02 \leq x \leq 0.22$, and $0 < y \leq 1.20$, as a non-reducing dielectric ceramic constituting the ceramic layers, material powders having an average diameter of 0.3 $\mu$m for the ceramic were weighed, mixed, and calcined to prepare a calcined mixture. A polyvinyl butyral-based binder and an organic solvent, for example, ethanol, were added thereto, and those were wet-mixed with a ball mill so as to prepare ceramic slurry. Thereafter, the resulting ceramic slurry was shaped into sheets by a doctor blade method so as to produce rectangular ceramic green sheets of 5 $\mu$m in thickness.

100 g of Ni powder produced using a chemical vapor deposition method was dispersed into 0.2 liters of ethanol so as to produce a suspension. The resulting suspension was subjected to a dispersion treatment with an ultrasonic homogenizer. A predetermined amount of magnesium acetate as the compound A and a predetermined amount of tetrapropoxytitanium as the compound B were prepared. Those were dissolved into the aforementioned suspension and were agitated so as to produce mixed suspensions for Samples 1 to 15.

Next, a mixed solution of 10 g of pure water and 10 g of ammonia water was dropped into each of the mixed suspensions for Samples 1 to 15 using a roller pump. Subsequently, each of the resulting mixture was agitated for 12 hours so that magnesium acetate as the compound A was adhered to the surface of the Ni powder, and tetrapropoxytitanium as the compound B was hydrolyzed and was adhered to the surface of the Ni powder. Then, solid-liquid separation was performed by decantation, and the resulting precipitate was dried at 120° C. for 12 hours so as to produce each of conductive powders of Samples 1 to 15, to which a hydrolysis product of tetrapropoxytitanium and magnesium acetate were adhered. The contents of the hydrolysis product of tetrapropoxytitanium and the magnesium acetate in terms of $TiO_2$ and MgO, respectively, are shown in Table 1.

Conductive powders of Samples 16 to 18 in which magnesium acetate as the compound A was only adhered to the surface of the Ni powder were produced in a manner similar to that in the aforementioned Samples 1 to 15, except that tetrapropoxytitanium as the compound B was not added into the suspension.

42% by weight of each of conductive powders of Samples 1 to 18, 44% by weight of an organic vehicle produced by dissolving 6 parts by weight of ethyl cellulose-based organic binder into 94 parts by weight of terpineol, and 14% by weight of terpineol were dispersed and were mixed by a ball mill method so as to produce conductive pastes of Samples 1 to 18.

Regarding each of the samples, the contents in terms of oxides relative to 100% by weight of the conductive powder, and a mole ratio $TiO_2$/MgO are summarized in Table 1.

The aforementioned ceramic green sheets were screen printed with each of the conductive pastes of Samples 1 to 18 so as to produce conductive paste films for constituting the internal electrodes. At this time, the thickness of electrode coating, that is, the thickness in terms of Ni metal determined by an X-ray coating thickness gauge, was adjusted to 0.5 μm by changing the thickness of the screen pattern.

Subsequently, a ceramic laminate was produced in which a plurality of aforementioned ceramic green sheets were laminated so that the sides exposing the conductive paste film thereof appeared on alternate sheets. The resulting ceramic laminate was heated to a temperature of 300° C. in an atmosphere of nitrogen so as to burn the organic binder, and thereafter, was baked in a non-reducing atmosphere of $H_2$—$N_2$—$H_2O$ gas so as to produce ceramic laminates of Samples 1 to 18. Regarding the step of baking, the temperature was raised at a rate of 200° C./hr, and was kept at 1,200° C. for 2 hours. The cooling rate was 200° C./hr.

Both end faces of the ceramic laminates of Samples 1 to 18 were coated with a conductive paste containing silver, and those were baked in an atmosphere of $N_2$-Air at a temperature of 800° C., so that terminal electrodes electrically connected to the internal electrodes were formed. Thereafter, Ni plating layers were formed on the aforementioned terminal electrodes, and furthermore, solder plating layers were formed on the Ni plating layers so as to produce monolithic capacitors of Samples 1 to 18. The external dimensions of the resulting monolithic capacitor were 1.6 mm in width, 3.2 mm in length and 1.2 mm in thickness. The thickness of the internal electrode was 0.7 μm, the thickness of the dielectric ceramic layer interposed between the internal electrodes was 3 μm, and the total number of the effective dielectric ceramic layers was 150.

Regarding the monolithic capacitors of Samples 1 to 18, delamination occurrence rates, dielectric constants, and average failure times in accelerated life tests were measured. The results thereof and evaluation results are summarized in Table 1.

Regarding the delamination occurrence rate, 100 test pieces of each Sample were prepared and were cut in a plane orthogonal to the direction of length. The cut surface was polished while being fixed with a resin, and the polished surface was observed with a microscope for the presence or absence of cracks. The cracks were counted and the occurrence rates relative to the total number of 100 were determined.

Regarding the average failure times in accelerated life tests, changes of insulation resistance of the test pieces with time were measured while 10 V/mm of direct current voltage was applied at 150° C. The time at which the insulation resistance reached $10^5 \Omega$ or less was regarded as the time of failure occurrence, and an average time elapsed until the failure occurred of the 100 test pieces was determined.

Regarding the evaluation, samples in which the delamination occurrence rate was 0%, the dielectric constant was higher than those of Samples 17 and 18 as comparative examples, and the average failure time was greater than those of Samples 17 and 18 as comparative examples were indicated as "Excellent" as samples within an especially preferable range of the present invention. Samples in which only the dielectric constant was lower than those of monolithic capacitors of Samples 17 and 18 as comparative examples were indicated as "Good" as samples within a preferable range of the present invention. Samples in which the dielectric constant or the average failure time was at a low level compared to that of the aforementioned samples indicated as "Excellent" or "Good", but the effects were superior compared to those of the monolithic capacitors of Samples 17 and 18 were indicated as "Fair" as samples within the range of the present invention. Samples of comparative examples were indicated as "Poor".

TABLE 1

| | Conductive Powder | | | Monolithic Capacitor | | | |
| | | Compound B | | | | | |
| Sample No. | Compound A Magnesium acetate Content in terms of MgO (wt %) | Tetrapropoxy titanium Content in terms of $TiO_2$ (wt %) | $TiO_2$/MgO (mol %) | Delamination Occurrence Rate (n = 100) | Dielectric Constant | Accelerated Life Test Average Failure Time (hr) | Evaluation |
|---|---|---|---|---|---|---|---|
| 1 | 0.3 | 0.1 | 0.2 | 0 | 2,070 | 78 | Good |
| 2 | 0.1 | 0.1 | 0.5 | 0 | 3,130 | 77 | Excellent |
| 3 | 0.01 | 0.1 | 4.0 | 0 | 3,160 | 80 | Excellent |
| 4 | 0.008 | 0.1 | 6.0 | 0 | 2,780 | 30 | Good |
| 5 | 3.0 | 1.0 | 0.2 | 0 | 2,100 | 81 | Good |
| 6 | 1.0 | 1.0 | 0.5 | 0 | 3,180 | 76 | Excellent |
| 7 | 0.1 | 1.0 | 4.0 | 0 | 3,230 | 75 | Excellent |
| 8 | 0.8 | 1.0 | 6.0 | 0 | 2,600 | 33 | Good |
| 9 | 13.0 | 5.0 | 0.2 | 0 | 2,080 | 80 | Good |
| 10 | 5.0 | 5.0 | 0.5 | 0 | 3,480 | 79 | Excellent |
| 11 | 0.6 | 5.0 | 4.0 | 0 | 3,340 | 72 | Excellent |
| 12 | 0.4 | 5.0 | 6.0 | 0 | 3,210 | 37 | Good |
| 13 | 18.0 | 7.0 | 0.2 | 0 | 1,680 | 26 | Fair |
| 14 | 7.0 | 7.0 | 0.5 | 0 | 2,690 | 22 | Fair |
| 15 | 0.9 | 7.0 | 4.0 | 0 | 3,120 | 24 | Fair |
| 16 | 1.0 | 0.0 | 0.0 | 100 | — | — | Poor |
| 17 | 5.0 | 0.0 | 0.0 | 82 | 2,150 | 2 | Poor |
| 18 | 10.0 | 0.0 | 0.0 | 55 | 1,730 | 3 | Poor |

As is clear from Table 1, regarding the monolithic capacitors of Samples 2, 3, 6, 7, 10 and 11, in which tetrapropoxytitanium as the compound B was hydrolyzed and was adhered at a content of 0.1 to 5.0% by weight in terms of $TiO_2$ relative to 100% by weight of the conductive powder, and the mole ratio of the amount of Ti in terms of $TiO_2$ contained in tetrapropoxytitanium as the compound B, relative to the amount of Mg in terms of MgO contained in magnesium acetate as the compound A, was within the range of 0.5 to 4.0, the delamination occurrence rates of all samples were 0%, the dielectric constants were sufficiently high as 3,130 to 3,480 compared to the dielectric constant of 2,150 of the monolithic capacitor of Sample 17 as the comparative example, and the average failure times in the accelerated life tests were very long as 75 to 80 hours compared to the average failure time of 3 hours of the monolithic capacitor of Sample 18 as the comparative example, so that these samples were within the especially preferable range of the present invention.

Regarding the monolithic capacitors of Samples 1, 5 and 9, in which tetrapropoxytitanium as the compound B was hydrolyzed and was adhered at a content of 0.1 to 5.0% by weight in terms of $TiO_2$ relative to 100% by weight of the conductive powder, and the mole ratio of the amount of Ti in terms of $TiO_2$ contained in tetrapropoxytitanium as the compound B, relative to the amount of Mg in terms of MgO contained in magnesium acetate as the compound A, was less than 0.5, the dielectric constants were 2,070 to 2,100 and were slightly inferior to the dielectric constant of 2,150 of the monolithic capacitor of Sample 17 as the comparative example, although these values were within the acceptable range as a dielectric constant of a monolithic capacitor. Furthermore, the delamination occurrence rates of all samples were 0%, and the average failure times in the accelerated life tests were very long as 78 to 81 hours compared to the average failure time of 3 hours of the monolithic capacitor of Sample 18 as the comparative example, so that these samples were within the preferable range of the present invention.

Regarding the monolithic capacitors of Samples 4, 8 and 12, in which tetrapropoxytitanium as the compound B was hydrolyzed and was adhered in the content of 0.1 to 5.0% by weight in terms of $TiO_2$ relative to 100% by weight of the conductive powder, and the mole ratio of the amount of Ti in terms of $TiO_2$ contained in tetrapropoxytitanium as the compound B, relative to the amount of Mg in terms of MgO contained in magnesium acetate as the compound A, exceeded 4.0, the average failure times in the accelerated life tests were short as 30 to 37 hours and were inferior to those of the aforementioned monolithic capacitors of Samples 2, 3, 6, 7, 10 and 11 which were within the especially preferable range of the present invention, but the aforementioned average failure times were very long compared to the average failure time of 3 hours of the monolithic capacitor of Sample 18 as the comparative example. In addition, the delamination occurrence rates of all samples were 0%, and the dielectric constants were sufficiently high at 2,600 to 3,210 compared to the dielectric constant of 2,150 of the monolithic capacitor of Sample 17 as the comparative example, so that these samples were within the preferable range of the present invention.

Regarding the monolithic capacitors of Samples 13 to 15, in which tetrapropoxytitanium as the compound B was hydrolyzed and was adhered in the content of 7.0% by weight in terms of $TiO_2$ relative to 100% by weight of the conductive powder, the dielectric constant were 1,680 to 3,120, the value of Sample 13 was inferior to the dielectric constant of 2,150 of the monolithic capacitor of Sample 17 as the comparative example. The average failure times in the accelerated life tests were short as 22 to 26 hours and were inferior to those of the aforementioned monolithic capacitors of Samples 2, 3, 6, 7, 10 and 11 which were within the especially preferable range of the present invention, but the aforementioned average failure times were within the acceptable range as a dielectric constant of a monolithic capacitor, and were sufficiently long compared to the average failure time of 3 hours of the monolithic capacitor of Sample 18 as the comparative example. In addition, the delamination occurrence rates of all samples were 0%, so that these samples were within the range of the present invention.

On the other hand, regarding the monolithic capacitors of Samples 16 to 18, in which the compound B was not hydrolyzed and was not adhered to the Ni powder, the delamination occurrence rates were high as 55% to 100%, and the average failure times in the accelerated life tests could not be measured or were very low as 3 hours or less, so that these samples were inferior. Regarding the monolithic capacitor of Sample 16, since the delamination occurrence rates were 100%, the dielectric constant and the average failure time could not be measured.

Example 2

The conductive powders of Samples 19 to 36 were prepared and the monolithic capacitors of Samples 19 to 36 were produced in a manner similar to that in Example 1, except that magnesium naphthenate was used as the compound A, and tetrabutoxyzirconium was used as the compound B. The contents in terms of oxides relative to 100% by weight of the conductive powder and the mole ratio $ZrO_2/MgO$ of each of samples were as shown in Table 2.

Regarding the monolithic capacitors of Samples 19 to 36, delamination occurrence rates, dielectric constants, and average failure times in accelerated life tests were measured. The results thereof and evaluation results are summarized in Table 2. The methods for each of measurements and evaluations were similar to those in Example 1.

TABLE 2

| | Conductive Powder | | | Monolithic Capacitor | | | |
|---|---|---|---|---|---|---|---|
| | Compound A | Compound B | | | | | |
| Sample No. | Magnesium naphthenate Content in terms of MgO (wt %) | Tetrabutoxy zirconium Content in terms of $ZrO_2$ (wt %) | $ZrO_2$/MgO (mol %) | Delamination Occurrence Rate (n = 100) | Dielectric Constant | Accelerated Life Test Average Failure Time (hr) | Evaluation |
| 19 | 0.2 | 0.1 | 0.2 | 0 | 2,030 | 80 | Good |
| 20 | 0.07 | 0.1 | 0.5 | 0 | 3,150 | 76 | Excellent |
| 21 | 0.01 | 0.1 | 4.0 | 0 | 3,170 | 82 | Excellent |
| 22 | 0.005 | 0.1 | 6.0 | 0 | 2,760 | 31 | Good |
| 23 | 2.0 | 1.0 | 0.2 | 0 | 2,140 | 83 | Good |
| 24 | 0.7 | 1.0 | 0.5 | 0 | 3,200 | 76 | Excellent |

TABLE 2-continued

| | Conductive Powder | | | Monolithic Capacitor | | | |
|---|---|---|---|---|---|---|---|
| | Compound A | Compound B | | | | | |
| Sample No. | Magnesium naphthenate Content in terms of MgO (wt %) | Tetrabutoxy zirconium Content in terms of ZrO$_2$ (wt %) | ZrO$_2$/MgO (mol %) | Delamination Occurrence Rate (n = 100) | Dielectric Constant | Accelerated Life Test Average Failure Time (hr) | Evaluation |
| 25 | 0.1 | 1.0 | 4.0 | 0 | 3,230 | 75 | Excellent |
| 26 | 0.05 | 1.0 | 6.0 | 0 | 2,590 | 33 | Good |
| 27 | 8.0 | 5.0 | 0.2 | 0 | 2,020 | 81 | Good |
| 28 | 3.0 | 5.0 | 0.5 | 0 | 3,490 | 78 | Excellent |
| 29 | 0.4 | 5.0 | 4.0 | 0 | 3,440 | 72 | Excellent |
| 30 | 0.3 | 5.0 | 6.0 | 0 | 3,310 | 39 | Good |
| 31 | 11.0 | 7.0 | 0.2 | 0 | 1,800 | 28 | Fair |
| 32 | 5.0 | 7.0 | 0.5 | 0 | 2,690 | 24 | Fair |
| 33 | 0.6 | 7.0 | 4.0 | 0 | 3,120 | 23 | Fair |
| 34 | 1.0 | 0.0 | 0.0 | 100 | — | — | Poor |
| 35 | 5.0 | 0.0 | 0.0 | 80 | 2,140 | 2 | Poor |
| 36 | 10.0 | 0.0 | 0.0 | 53 | 1,730 | 3 | Poor |

As is clear from Table 2, regarding the monolithic capacitors of Samples 20, 21, 24, 25, 28 and 29 in which tetrabutoxyzirconium as the compound B was adhered at a content of 0.1 to 5.0% by weight in terms of ZrO$_2$ relative to 100% by weight of the conductive powder, and the mole ratio of the amount of Zr in terms of ZrO$_2$ contained in tetrabutoxyzirconium as the compound B, relative to the amount of Mg in terms of MgO contained in magnesium naphthenate as the compound A, was within the range of 0.5 to 4.0, the delamination occurrence rates of all samples were 0%, the dielectric constants were sufficiently high at 3,150 to 3,490 compared to the dielectric constant of 2,140 of the monolithic capacitor of Sample 35 as the comparative example, and the average failure times in the accelerated life tests were very long at 72 to 82 hours compared to the average failure time of 3 hours of the monolithic capacitor of Sample 36 as the comparative example, so that these samples were within the especially preferable range of the present invention.

Regarding the monolithic capacitors of Samples 19, 23 and 27, in which tetrabutoxyzirconium as the compound B was adhered at a content of 0.1 to 5.0% by weight in terms of ZrO$_2$ relative to 100% by weight of the conductive powder, and the mole ratio of the amount of Zr in terms of ZrO$_2$ contained in tetrabutoxyzirconium as the compound B, relative to the amount of Mg in terms of MgO contained in magnesium naphthenate as the compound A, was less than 0.5, the dielectric constants were 2,020 to 2,140 and were equivalent to or slightly inferior to the dielectric constant of 2,140 of the monolithic capacitor of Sample 35 as the comparative example, although these values were within the acceptable range as a dielectric constant of a monolithic capacitor. Furthermore, the delamination occurrence rates of all samples were 0%, and the average failure times in the accelerated life tests were very long at 80 to 83 hours compared to the average failure time of 3 hours of the monolithic capacitor of Sample 36 as the comparative example, so that these samples were within the preferable range of the present invention.

Regarding the monolithic capacitors of Samples 22, 26 and 30, in which tetrabutoxyzirconium as the compound B was adhered in the content of 0.1 to 5.0% by weight in terms of ZrO$_2$ relative to 100% by weight of the conductive powder, and the mole ratio of the amount of Zr in terms of ZrO$_2$ contained in tetrabutoxyzirconium as the compound B, relative to the amount of Mg in terms of MgO contained in magnesium naphthenate as the compound A, exceeded 4.0, the average failure times in the accelerated life tests were short at 31 to 39 hours and were inferior to those of the aforementioned monolithic capacitors of Samples 20, 21, 24, 25, 28 and 29 which were within the especially preferable range of the present invention, but the aforementioned average failure times were sufficiently long compared to the average failure time of 3 hours of the monolithic capacitor of Sample 36 as the comparative example. In addition, the delamination occurrence rates of all samples were 0%, and the dielectric constants were sufficiently high at 2,590 to 3,310 compared to the dielectric constant of 2,140 of the monolithic capacitor of Sample 35 as the comparative example, so that these samples were within the preferable range of the present invention.

Regarding the monolithic capacitors of Samples 31 to 33 in which tetrabutoxyzirconium as the compound B was hydrolyzed and was adhered in the content of 7.0% by weight in terms of ZrO$_2$ relative to 100% by weight of the conductive powder, the dielectric constants were 1,800 to 3,120, and the value of Sample 31 was inferior to the dielectric constant of 2,140 of the monolithic capacitor of Sample 35 as the comparative example. The average failure times in the accelerated life tests were short as 23 to 28 hours and were inferior to those of the aforementioned monolithic capacitors of Samples 20, 21, 24, 25, 28 and 29 which were within the especially preferable range of the present invention, but the aforementioned average failure times were within the acceptable range as a dielectric constant of a monolithic capacitor, and were very long compared to the average failure time of 3 hours of the monolithic capacitor of Sample 36 as the comparative example. In addition, the delamination occurrence rates of all samples were 0%, so that these samples were within the range of the present invention.

On the other hand, regarding the monolithic capacitors of Samples 34 to 36 in which the compound B was not adhered to the Ni powder, the delamination occurrence rates were high as 53% to 100%, and the average failure times in the accelerated life tests could not be measured or were very low as 3 hours or less, so that these samples were inferior. Regarding the monolithic capacitor of Sample 34, since the delamination occurrence rates were 100%, the dielectric constant and the average failure time could not be measured.

As described above, the conductive paste of the present invention is composed of the conductive powder primarily composed of Ni, the organic vehicle, and the compound A containing at least one of Mg and Ca and being at least one selected from the group consisting of organic acid metal salt, oxide powder, metal organic complex salt and alkoxide, in which a compound B having the hydrolyzable reactive group containing at least one of Ti and Zr adheres to the surface of the aforementioned conductive powder. Therefore, for example, when the conductive paste of the present invention is used for forming the internal electrodes of the laminated ceramic electronic component, the delamination does not occur during the step of baking, and the effect of producing laminated ceramic electronic component having superior thermal shock resistance and superior moisture load resistance characteristics can be exhibited.

Furthermore, the conductive paste of the present invention is composed of the conductive powder primarily comprising Ni and the organic vehicle, in which the compound A and the compound B adhere to the surface of the aforementioned conductive powder, the compound A contains at least one of Mg and Ca and is at least one selected from the group consisting of organic acid metal salt, oxide powder, metal organic complex salt and alkoxide, and the compound B has a reactive group containing at least one of Ti and Zr. Therefore, for example, when the conductive paste of the present invention is used for forming the internal electrodes of the laminated ceramic electronic component, delamination does not occur during the step of baking, and the effect of producing laminated ceramic electronic component having superior thermal shock resistance and moisture load resistance characteristics can be exhibited.

In addition, since the conductive paste primarily contains Ni, the invention can contribute to reduce the cost of the laminated ceramic electronic component, and can contribute to decrease the layer thickness and to increase the number of layers of the ceramic layers.

What is claimed is:

1. A conductive paste, comprising:
    a conductive powder comprising Ni having a hydrolyzed compound B adhered to the surface of the conductive powder, said hydrolyzed compound B comprising at least one of Ti and Zr
    an organic vehicle; and
    a compound A which contains at least one of Mg and Ca and which is selected from the group consisting of organic acid metal salt, oxide powder, metal organic complex salt and alkoxide,
    wherein the mole ratio of the total amount of Ti and Zr, in terms of $TiO_2$ and $ZrO_2$, contained in said compound B, relative to the total amount of Mg and Ca, in terms of MgO and CaO contained in said compound A, is about 0.5 to 4.0.

2. A conductive paste, according to claim 1, wherein compound A is adhered to the surface of the conductive powder.

3. A conductive paste according to claim 2, wherein said compound B has an alkoxyl group.

4. A conductive paste according to claim 1, wherein said compound B is an alkoxide.

5. A conductive paste according to claim 4, wherein the adhered amount of said compound B is about 0.1% to 5.0% by weight in terms of $TiO_2$ and $ZrO_2$ relative to 100% by weight of said conductive powder.

6. A conductive paste according to claim 5, wherein the mole ratio of the total amount of Ti and Zr, in terms of $TiO_2$ and $ZrO_2$, contained in said compound B, relative to the total amount of Mg and Ca, in terms of MgO and CaO contained in said compound A, is about 0.5 to 4.0.

7. A conductive paste according to claim 6, wherein the conductive powder has an average particle diameter of about 10 nm to 200 nm and wherein compound A is an organic acid salt of Mg.

8. A conductive paste according to claim 3, wherein said compound B is a coupling agent.

9. A conductive paste according to claim 1, wherein the adhered amount of said compound B is about 0.1% to 5.0% by weight in terms of $TiO_2$ and $ZrO_2$ relative to 100% by weight of said conductive powder.

10. A conductive paste according to claim 1, wherein said compound B is an acetylacetonate.

* * * * *